(12) United States Patent
Francis

(10) Patent No.: US 11,792,919 B2
(45) Date of Patent: Oct. 17, 2023

(54) CASE WITH ISOLATION BARRIERS

(71) Applicant: Murata Manufacturing Co., Ltd., Nagaokakyo (JP)

(72) Inventor: Lee Francis, Milton Keynes (GB)

(73) Assignee: MURATA MANUFACTURING CO., LTD., Kyoto (JP)

(*) Notice: Subject to any disclaimer, the term of this patent is extended or adjusted under 35 U.S.C. 154(b) by 206 days.

(21) Appl. No.: 17/427,954

(22) PCT Filed: Mar. 13, 2020

(86) PCT No.: PCT/US2020/022601
§ 371 (c)(1),
(2) Date: Aug. 3, 2021

(87) PCT Pub. No.: WO2020/190706
PCT Pub. Date: Sep. 24, 2020

(65) Prior Publication Data
US 2022/0132657 A1   Apr. 28, 2022

Related U.S. Application Data

(60) Provisional application No. 62/704,061, filed on Mar. 15, 2019.

(51) Int. Cl.
| | | |
|---|---|---|
| *H05K 1/02* | (2006.01) | |
| *H05K 1/18* | (2006.01) | |
| *H05K 7/14* | (2006.01) | |

(52) U.S. Cl.
CPC .......... *H05K 1/0256* (2013.01); *H05K 1/181* (2013.01); *H05K 7/1427* (2013.01); *H05K 2201/0761* (2013.01); *H05K 2201/09063* (2013.01); *H05K 2201/09972* (2013.01); *H05K 2201/1003* (2013.01)

(58) Field of Classification Search
CPC .................................................. H05K 1/0256
USPC ........................................................ 361/752
See application file for complete search history.

(56) References Cited

U.S. PATENT DOCUMENTS

| | | | |
|---|---|---|---|
| 8,134,343 | B2 | 3/2012 | Like et al. |
| 9,712,039 | B2 | 7/2017 | Fujii et al. |
| 10,003,274 | B2 | 6/2018 | Takahashi et al. |
| 2006/0044858 | A1 | 3/2006 | Holme Pedersen et al. |

(Continued)

FOREIGN PATENT DOCUMENTS

| | | |
|---|---|---|
| GB | 2555832 A | 5/2018 |
| JP | 2008177379 A | 7/2008 |

(Continued)

OTHER PUBLICATIONS

Official Communication issued in International Patent Application No. PCT/US2020/022601, dated Jul. 10, 2020.
Office Action in GB2111978.9, dated Aug. 24, 2022, 4 pages.

*Primary Examiner* — Stanley Tso
(74) *Attorney, Agent, or Firm* — KEATING & BENNETT, LLP

(57) ABSTRACT

A case includes a header with a first isolation barrier, a cover with a second isolation barrier, and a printed circuit board (PCB) including a slot in which the first isolation barrier or the second isolation barrier is located and a primary-circuit side and a secondary-circuit side located on opposites sides of the slot.

7 Claims, 8 Drawing Sheets

(56) References Cited

U.S. PATENT DOCUMENTS

| | | | |
|---|---|---|---|
| 2016/0088754 A1* | 3/2016 | Francis | H05K 13/04 |
| | | | 361/752 |
| 2016/0111965 A1* | 4/2016 | Wang | H01F 41/041 |
| | | | 363/21.04 |
| 2016/0359426 A1 | 12/2016 | Jitaru et al. | |
| 2017/0316863 A1 | 11/2017 | Francis | |
| 2020/0006332 A1* | 1/2020 | Bomberger | H01L 21/823431 |
| 2020/0006491 A1* | 1/2020 | Bomberger | H01L 21/02532 |
| 2020/0006504 A1* | 1/2020 | Bomberger | H01L 29/785 |
| 2020/0211754 A1* | 7/2020 | Zhang | H01F 27/2804 |

FOREIGN PATENT DOCUMENTS

| | | |
|---|---|---|
| JP | 3189331 U | 3/2014 |
| WO | 2016/069101 A1 | 5/2016 |

* cited by examiner

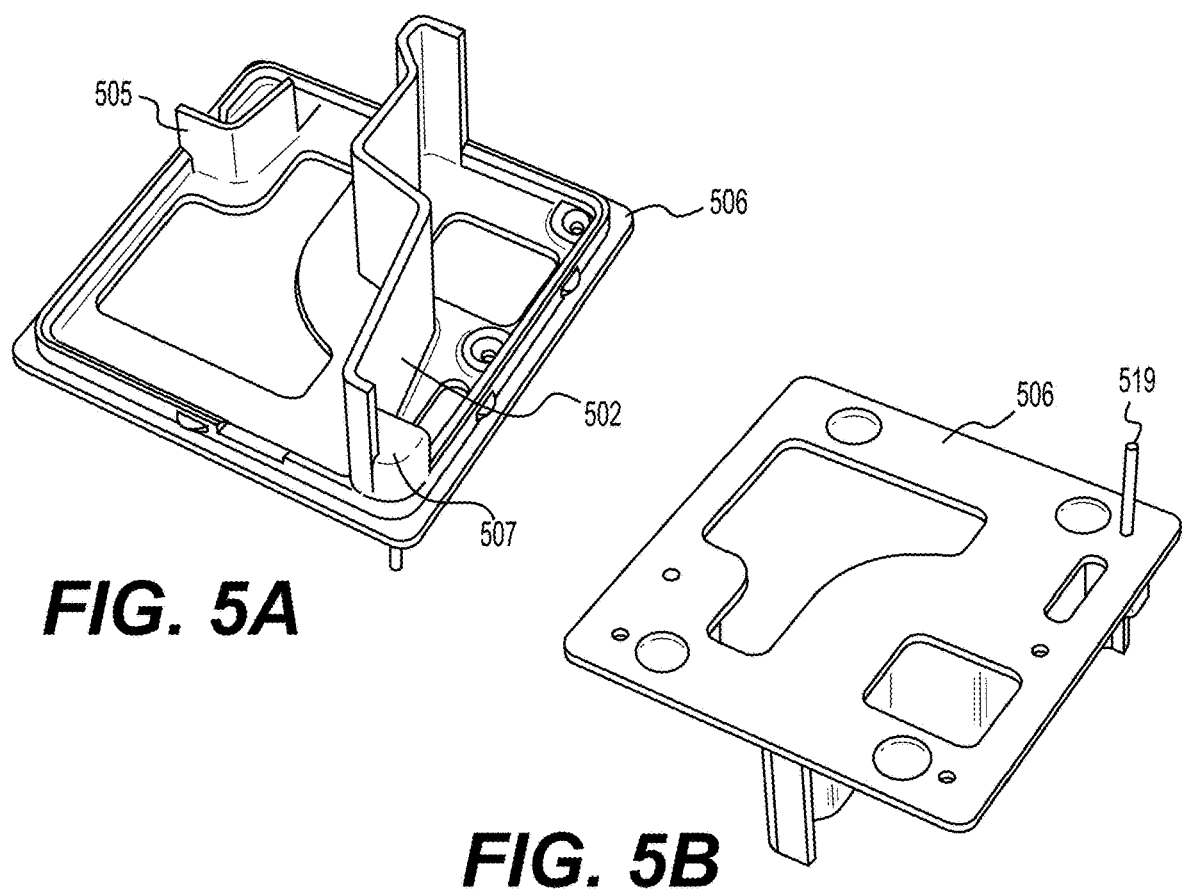
FIG. 5A
FIG. 5B
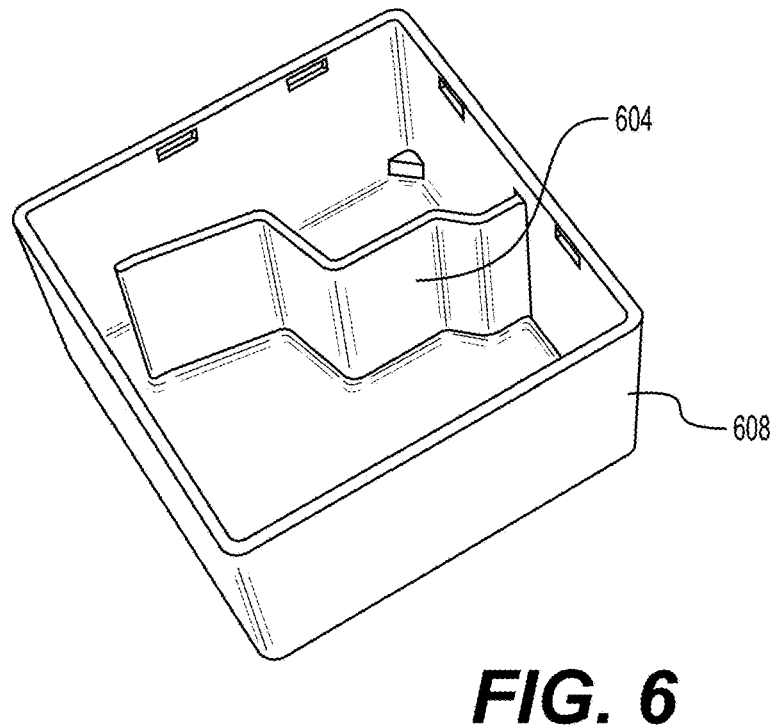
FIG. 6

CASE WITH ISOLATION BARRIERS

CROSS REFERENCE TO RELATED APPLICATIONS

This application claims the benefit of U.S. Patent Application No. 62/704,061 filed on Mar. 15, 2019. The entire contents of each application are hereby incorporated by reference.

BACKGROUND OF THE INVENTION

1. Field of the Invention

The present invention relates to cases. More specifically, the present invention relates to cases with isolation barriers.

2. Description of the Related Art

FIG. 1 shows a cross section of a known case 100 that includes components of a power converter. The components of the power converter include a printed circuit board (PCB) 110, primary side components 125, secondary side components 135, and a transformer. A primary circuit 120 is connected to the primary winding of the transformer, and a secondary circuit 130 is connected to the secondary winding of the transformer. Although not shown in FIG. 1, the power converter can be encapsulated within the case 100. The terminals 115 connected to the PCB 110 that extend beyond the opening in the case 110 can be used to attach the case 100 to a host PCB (not shown).

To ensure safety, certain minimum distances between the components of the primary and secondary circuits are maintained. Clearance distance 140, represented by the dotted line, is the shortest distance through air between two conductive parts, and creepage distance 150 is the shortest distance along a solid insulating material, including gaps less than 1 mm but not gaps greater than 1 mm. In FIG. 1, clearance 140 and creepage 150 distances of the components in the primary circuit 120 and the secondary circuit 130 is 10 mm, as required by Underwriter's Laboratories, Inc. (UL) standards. But this requires a large component-free region in between the primary and secondary components, making miniaturization difficult.

SUMMARY OF THE INVENTION

To overcome the problems described above, preferred embodiments of the present invention provide a case with isolation barriers that allows for miniaturization and ensures that proper clearance and creepage distances are maintained.

According to a preferred embodiment of the present invention, a case includes a header with a first isolation barrier, a cover with a second isolation barrier, and a printed circuit board (PCB) including a slot in which the first isolation barrier or the second isolation barrier is located, and a primary-circuit side and a secondary-circuit side located on opposites sides of the slot.

The case further preferably includes a transformer located on the PCB. The slot preferably does not bisect the PCB. Shapes of the slot and one of the first isolation barrier and the second isolation barrier preferably match or substantially match. Ends of the first isolation barrier preferably terminate at sides of the header.

The case further preferably includes a transformer with a primary winding and a secondary winding, a primary circuit connected to the primary winding, and a secondary circuit connected to the secondary winding, in which components of the primary circuit are located on the primary-circuit side of the PCB, and components of the secondary circuit are located on the secondary-circuit side of the PCB.

The first and second isolation barriers are preferably adjacent to each other such that any applicable creepage or clearance distance between the primary-circuit side and the secondary-circuit side is a distance between a top of a component on one of the primary-circuit side and the secondary-circuit side and a bottom of the PCB of the other of the secondary-circuit side and the primary-circuit side.

The above and other features, elements, characteristics, steps, and advantages of the present invention will become more apparent from the following detailed description of preferred embodiments of the present invention with reference to the attached drawings.

BRIEF DESCRIPTION OF THE DRAWINGS

FIGS. 5A and 5B show top and bottom views of a header of the case of FIG. 3.

FIG. 6 shows a bottom view of a cover of the case of FIG. 3.

DETAILED DESCRIPTION OF PREFERRED EMBODIMENTS

Figure 1:
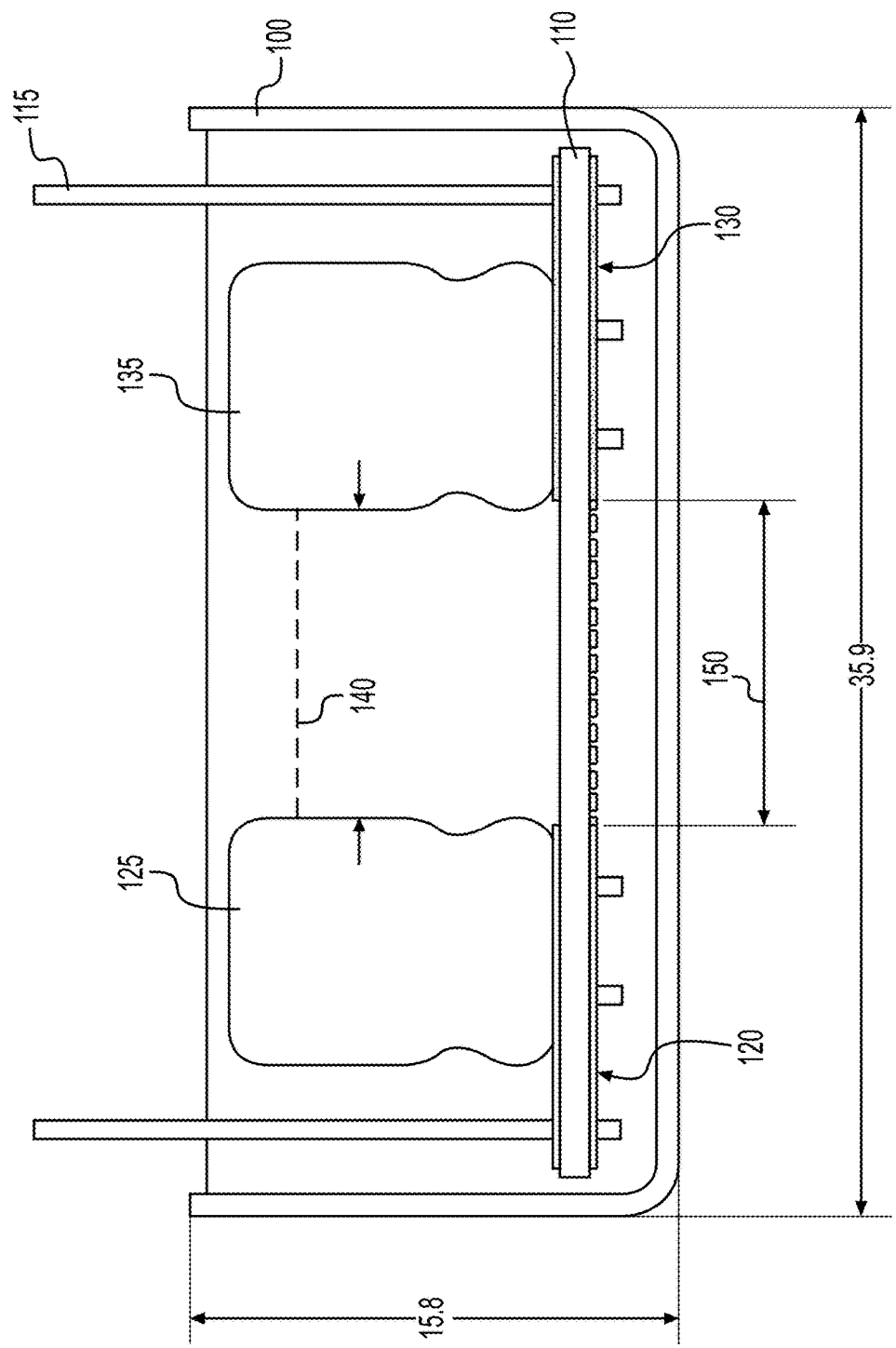
FIG. 1 shows a known case that can be used with a power converter.
Figure 2:
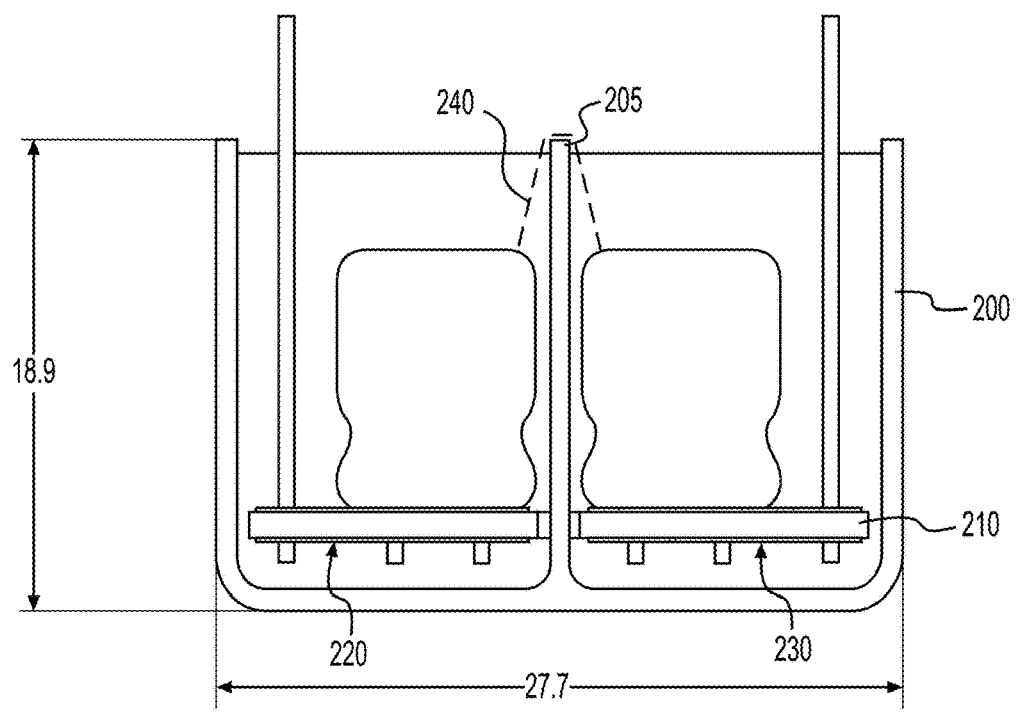
FIG. 2 shows a case with a single isolation barrier.

FIG. 2 shows a case 200 with a single isolation barrier 205. Because the clearance distance 240, which in FIG. 2 is between the top of the components of the primary circuits 220 and the secondary circuits 230 on the PCB 210, is over the top of the isolation barrier 205, the length of the case 200 can be reduced, but the height must be increased. As an example, in comparing FIGS. 1 and 2, the length can be reduced from 35.9 mm to 27.7 mm, and the height can be increased from 15.8 mm to 18.9 mm. In FIG. 2, the creepage distance is the shortest distance from the component of the primary circuit 220 to the wall, over the wall, and then to the component of the secondary circuit 230. The creepage distance is longer than the clearance distance 240.

Figure 3:
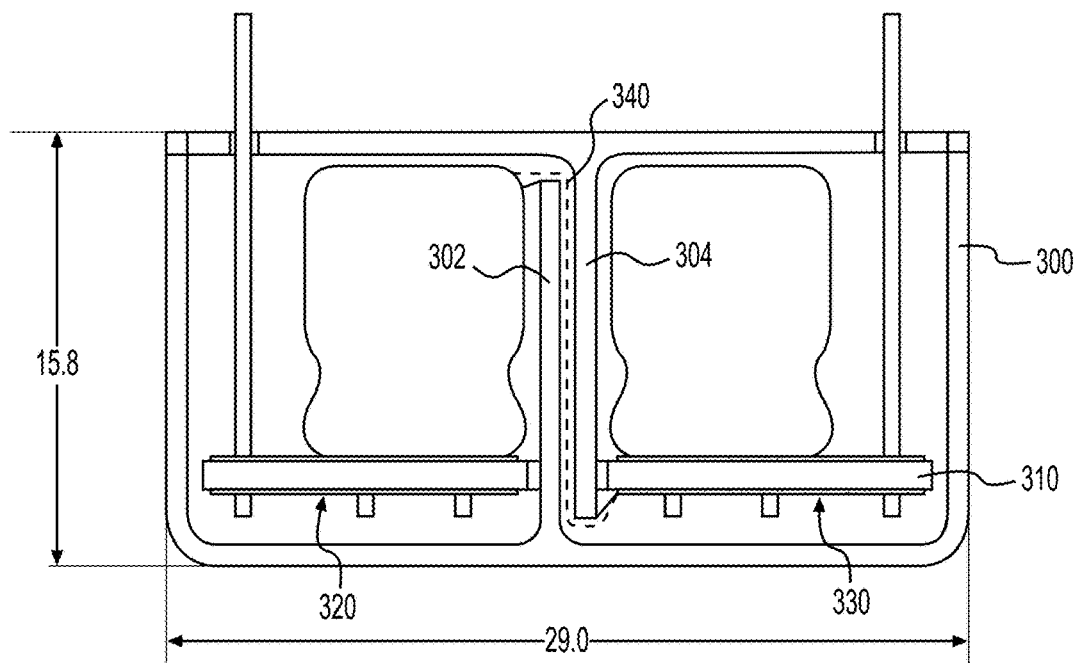
FIG. 3 shows a case with two isolation barriers.

FIG. 3 shows a case 300 with two isolation barriers 302 and 304. The clearance distance 340, which is between the top of the components of the primary circuit 320 and the bottom of the PCB 310 on the secondary-circuit side, can be increased, while maintaining the same height. In FIG. 3, the clearance distance 340 and the creepage distance are along the same path. As an example, in comparing FIGS. 1 and 3, the length can be reduced from 35.9 mm to 29.0 mm while maintaining a height of 15.8 mm. The specific dimensions shown in FIGS. 1-3 are examples only, and other dimensions could be used.

Figure 4A:
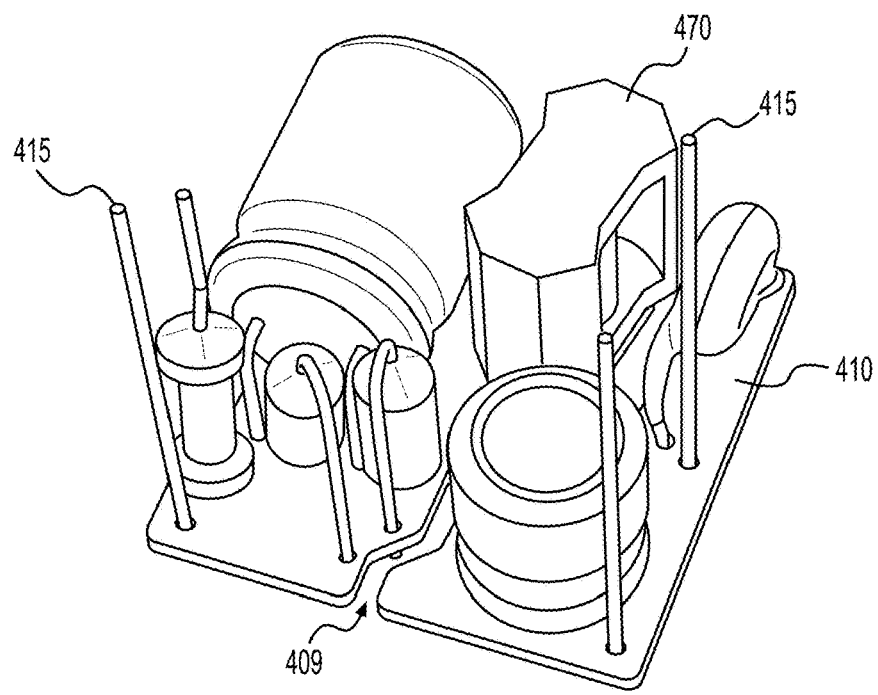
FIGS. 4A and 4B show a power converter assembly that can be used with the case shown in FIG. 3.
Figure 4B:
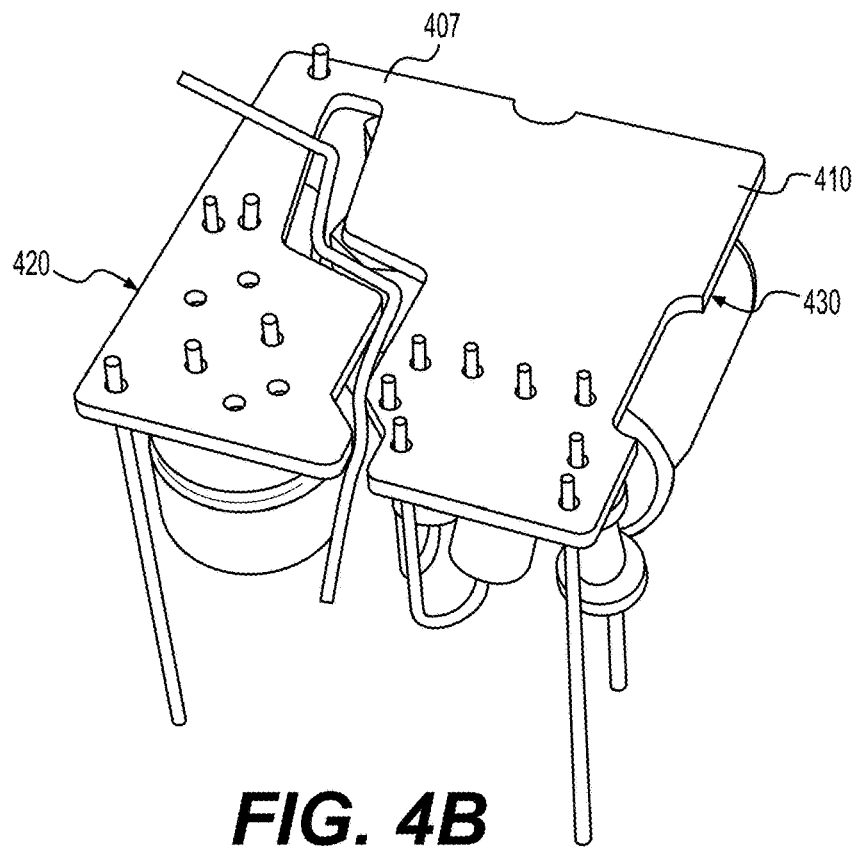

FIGS. 4A and 4B show a power converter assembly including a PCB 410 and components of the power converter arranged on the PCB 410. For clarity, only the larger components of the power converter are shown in FIGS. 4A and 4B. The PCB 410 includes an isolation slot 409 that separates the PCB 410 into a primary-circuit side 430 and a secondary-circuit side 420. The primary-circuit side 430 and the secondary-circuit side 420 of the PCB 410 are connected by a bridge 407. The bridge 407 can be a portion of the PCB 410 or can be separate from the PCB 410. There are no limitations on the size or the location of the bridge 407 so long as the minimum creepage and clearance distances are met. Conductive components in the primary-circuit side 430 and the secondary-circuit side 420 on the PCB 410 near the bridge 407 can be spaced apart from each such that the minimum creepage and clearance distances along a path through the bridge 407 and around the first and second isolation barriers are met.

Instead of using a slot and a bridge, it is possible to provide two separate PCBs, one to be used with the primary circuit and one to be used with secondary circuit. Using the bridge 407 and the slot 409 simplifies assembly and reduces cost because there is a single PCB 410 to be placed in the case. One end of the slot 409 terminates along one side of the PCB 410, which is open to the exterior of the PCB 410. In addition, the other end of the slot 409 ends in the interior of the PCB 410 such that the slot 409 does not bisect the PCB 410. The slot 409 can have any suitable shape as long as the PCB 410 is divided into a primary-circuit side 430 430 and a secondary-circuit side 420. Optionally, the slot 409 and bridge 407 can be arranged such that there are two bridges, one at each end of the slot 409.

As shown in FIG. 4A, the transformer 470, which includes both the primary and secondary windings, can be located on the primary-circuit side 420 of the PCB 410. The PCB 410 can include terminals or pins 415 that extend through the header to allow the case to be attached to a host PCB (not shown).

FIGS. 5A and 5B and FIG. 6 respectively show the header 506 and cover 608 of the case. FIGS. 5A and 5B show the header 506 with a first isolation barrier 502, and FIG. 6 shows the cover 608 with a second isolation barrier 604. As shown, the second isolation barrier 604 has the same or approximately the same shape within manufacturing tolerances as the slot 409 in the PCB 410 to allow the second isolation barrier 604 to be inserted into the slot 409. Similar to the slot 409, one end of the second isolation barrier 604 terminates at one side of the cover 608, and the other end of the second isolation barrier 604 terminates in the interior of the cover 608 such that the second isolation barrier 604 does not bisect the cover 608. The first isolation barrier 502 has a similar shape as the second isolation barrier 604. As shown in FIG. 5A, the ends of the first isolation barrier 502 can terminate at the sides of the header 506, bisecting the header 506. The first isolation barrier 502 can include a bridge that corresponds to the bridge 407 in the PCB 410. The header 506 can include a dummy pin 519 that is embedded in the header 506. The dummy pin 519 can be used to attach the case to a host PCB, and because the dummy pin 519 does not extend to the interior of the case, but is a molded feature 507, the dummy pin 519 does not interfere with the components within the case.

The header 506 and the cover 608 can have additional isolation barriers, for example, if different components have higher voltages than other components that would require larger minimum creepage and clearance distances. For example, FIG. 5A shows such an additional isolation barrier 505 in the upper left corner of the header 506. As shown in FIG. 5A, the additional isolation barrier 505 can have a smaller height than the height of the first isolation barrier 502. Optionally, the header 506 and the cover 608 can have barriers with different shapes such that the first isolation barrier 502 has the same or approximately the same shape within manufacturing tolerances as the slot 409 in the PCB 410 to allow the first isolation barrier 502 to be inserted into the slot 409, and the second isolation barrier 604 could include a bridge that corresponds to the bridge 407 in the PCB 410.

Figure 7A:
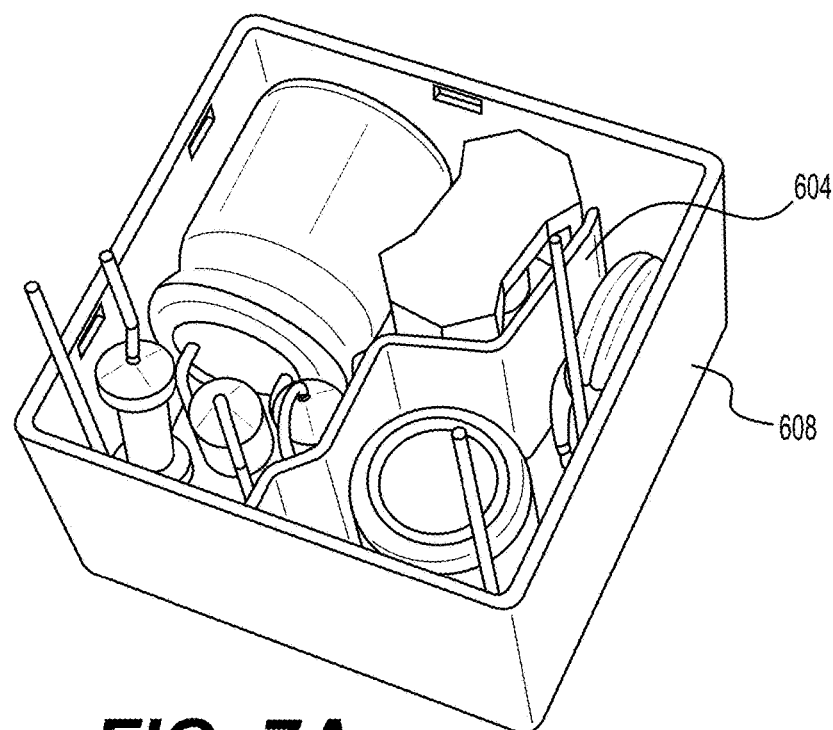
FIGS. 7A and 7B show the power converter assembly of FIG. 4 located in the cover of FIG. 6.
Figure 7B:
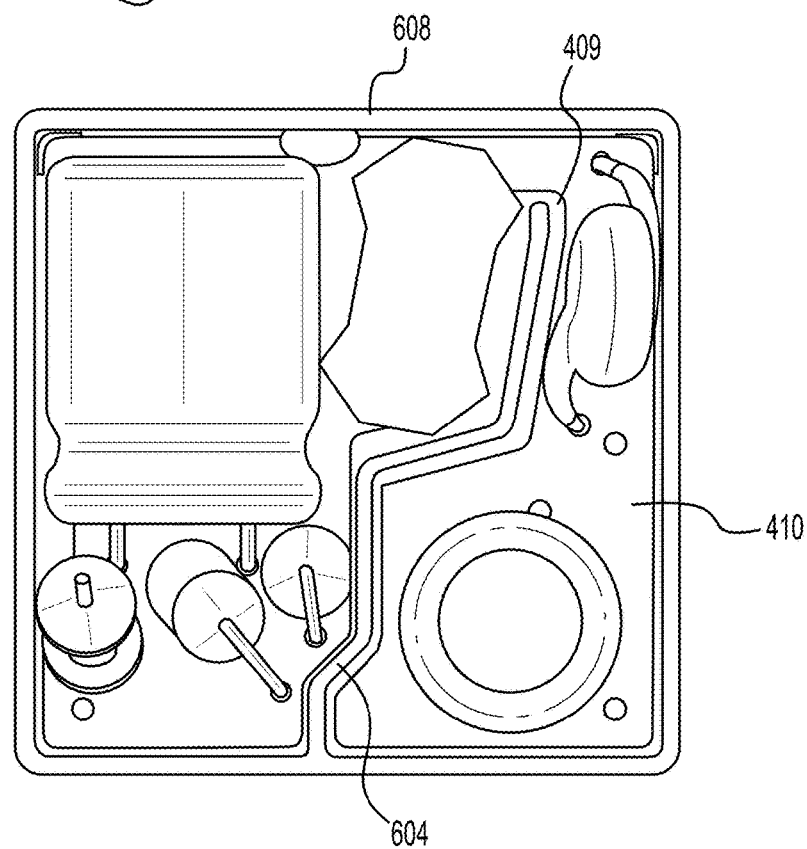
Figure 8A:
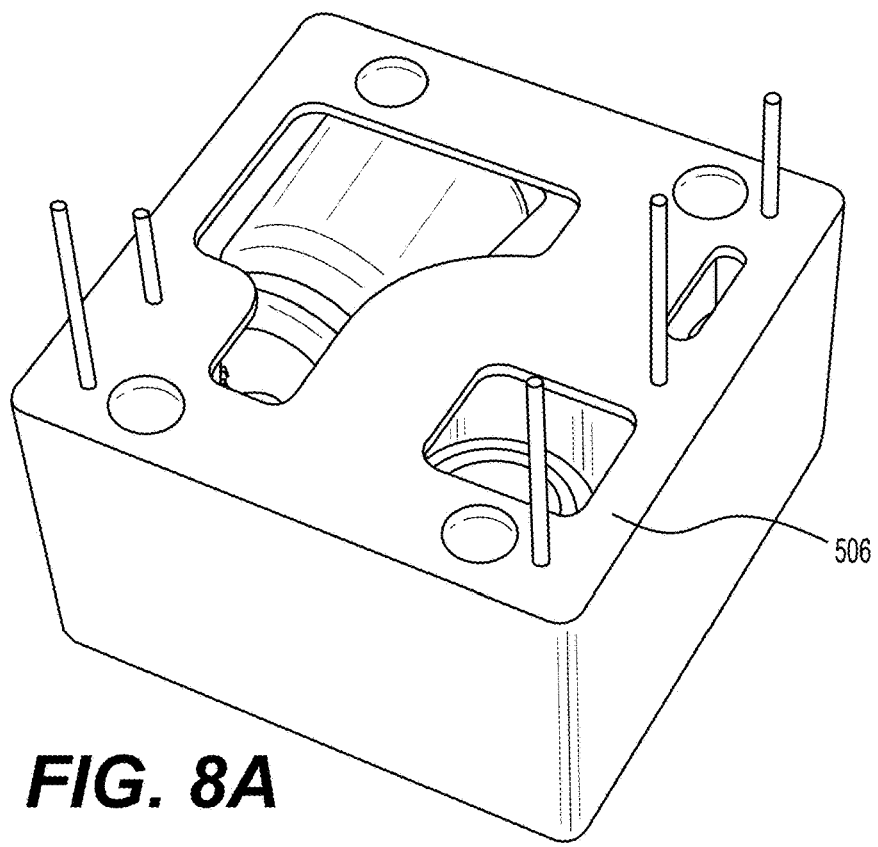
FIGS. 8A and 8B show an assembled case with header, cover, and power converter assembly.
Figure 8B:
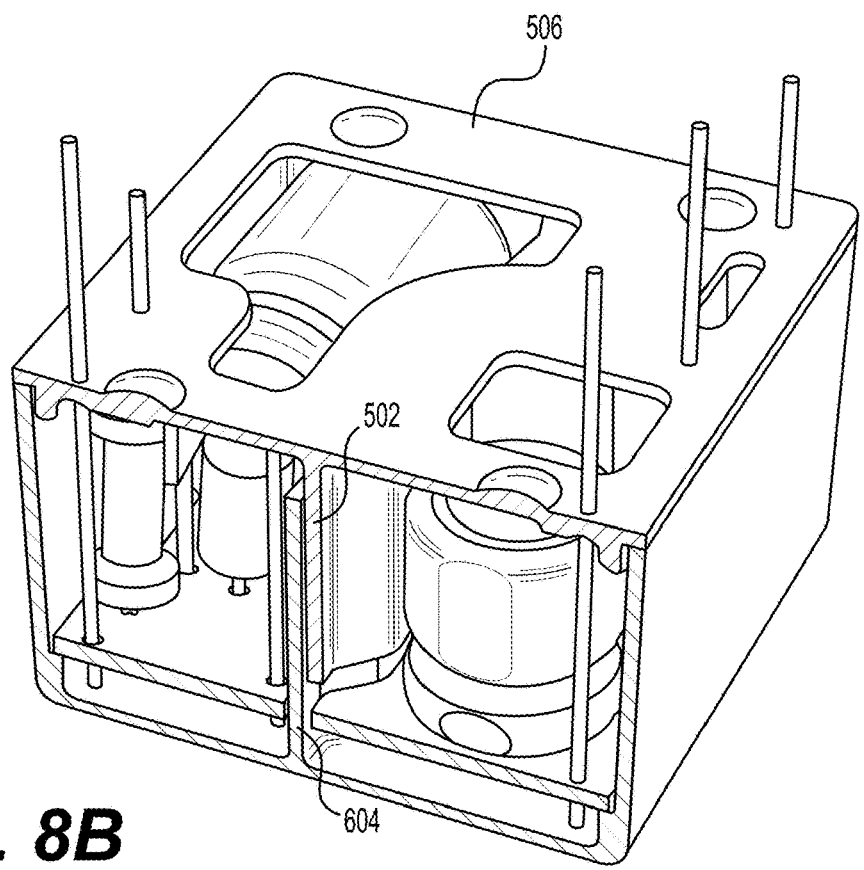

FIGS. 7A and 7B show the power converter assembly of FIGS. 4A and 4B inserted into the cover 608 of FIG. 6. As seen in FIG. 7B, the second isolation barrier 604 of the cover 608 is located in the slot 409 in the PCB 410. FIGS. 8A and 8B show the assembled case with the header 506 of FIGS. 5A and 5B, cover 608 of FIG. 6, and power converter assembly on the PCB 410 of FIG. 4. As shown in the cross section in FIG. 8B, the first and second isolation barriers 502 and 604 are adjacent to each other.

Figure 9:
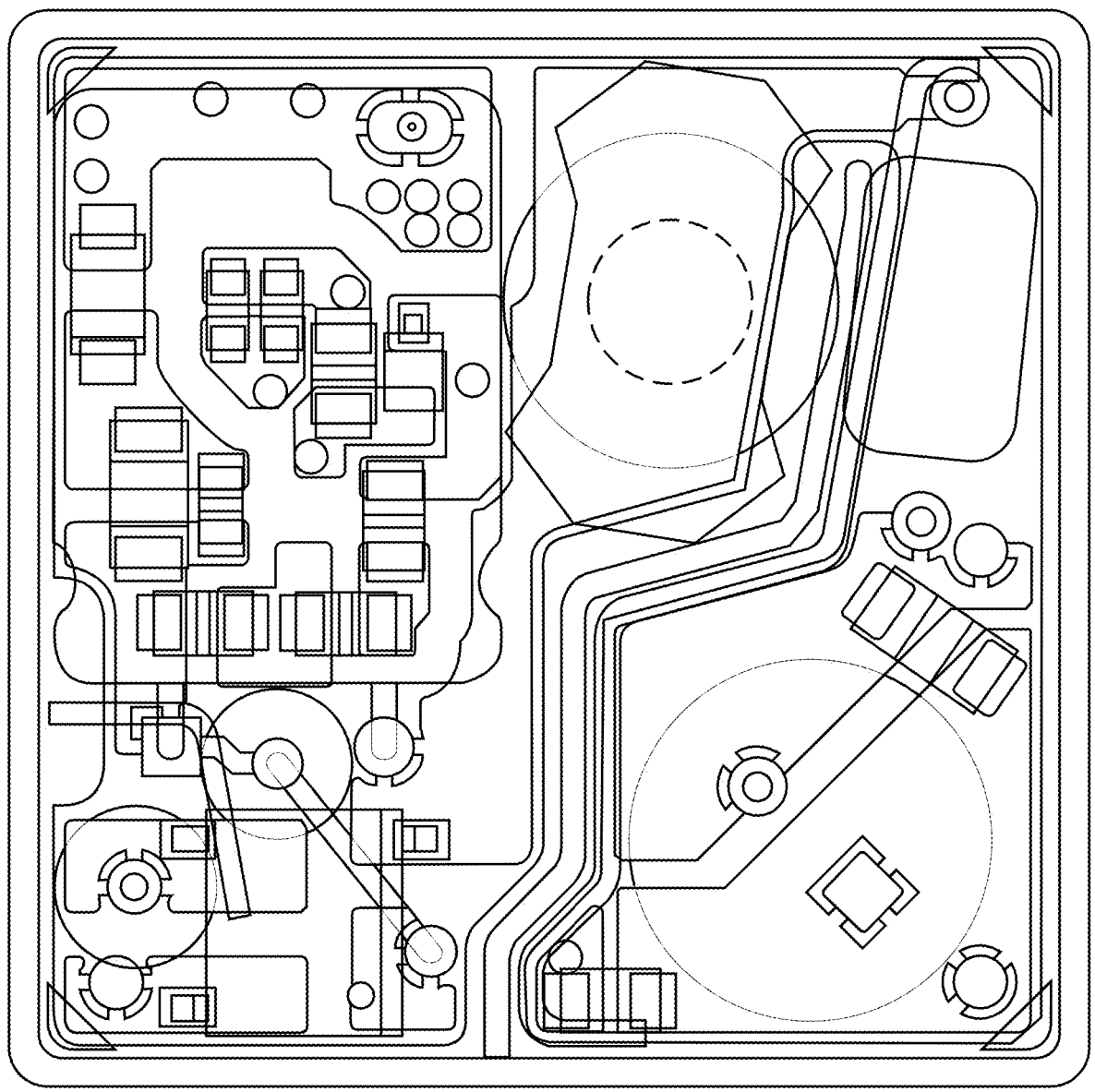
FIG. 9 shows a possible first side of a possible PCB layout.
Figure 10:
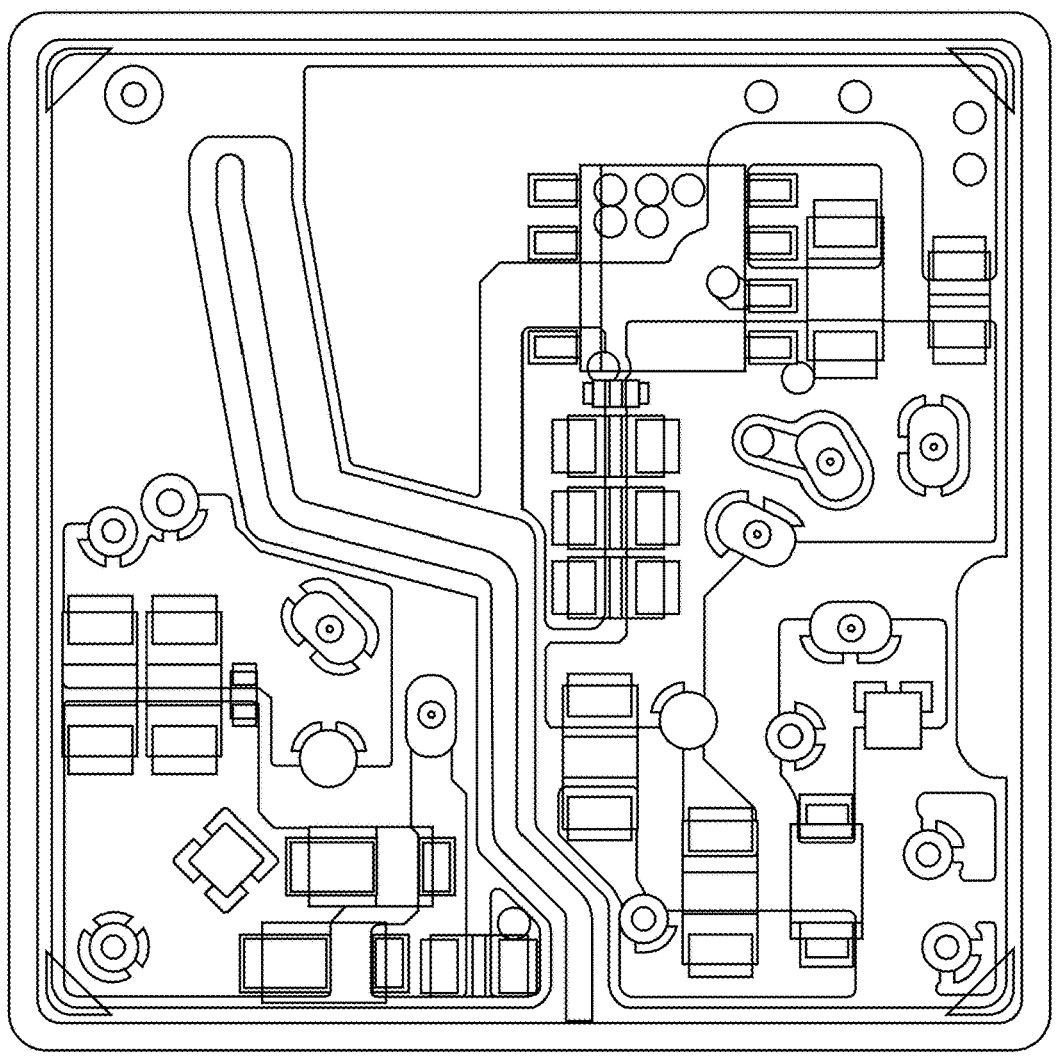
FIG. 10 shows a possible second side of a possible PCB layout.
Figure 11:
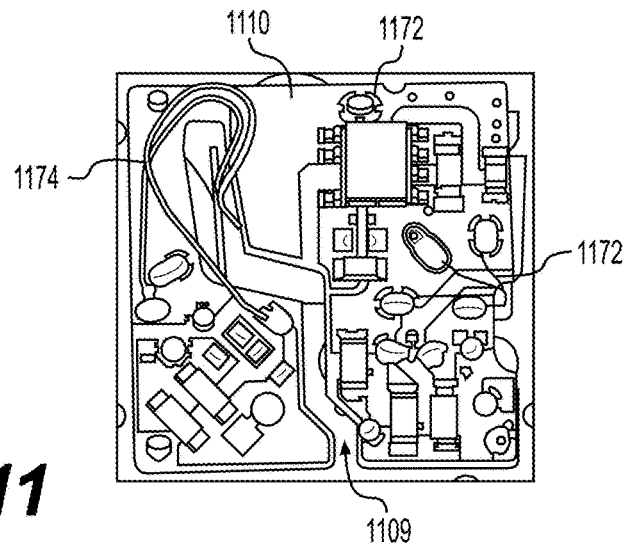
FIG. 11 shows the leads of the transformer connected to the PCB.

FIGS. 9-11 show specific examples of possible power converters that can be used with the case 300 in FIG. 3. Other power converters can also be used with the case 300 in FIG. 3. FIGS. 9 and 10 show a specific arrangement of the components on the first and second side of the PCB 900. FIGS. 9 and 10 show the smaller components that are not shown in other figures. Any suitable arrangement of components can be used. FIG. 11 shows that the primary leads 1172 of the transformer can be wrapped around an exterior edge of the PCB 1110 and that the secondary leads 1174 of the transformer can be routed through the slot 1109 of the PCB 1110. Because the secondary leads 1174 are insulated, the secondary leads 1174 do not compromise the minimum creepage and clearance distances. As examples, possible power converters that can be used with case 300 include ⅗ W or 10 W power converters. A 10 W power converter will require a larger case than a ⅗ W power converter because of the increase in the number of components and power.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A case comprising:
   a header with a first isolation barrier;
   a cover with a second isolation barrier; and
   a printed circuit board (PCB) including:
      a slot in which the first isolation barrier or the second isolation barrier is located; and
      a primary-circuit side and a secondary-circuit side located on opposites sides of the slot.

2. The case of claim 1, further comprising a transformer located on the PCB.

3. The case of claim 1, wherein the slot does not bisect the PCB.

4. The case of claim 1, wherein shapes of the slot and one of the first isolation barrier and the second isolation barrier match or substantially match.

5. The case of claim 1, wherein ends of the first isolation barrier terminate at sides of the header.

6. The case of claim 1, further comprising:
   a transformer with a primary winding and a secondary winding;
   a primary circuit connected to the primary winding; and a secondary circuit connected to the secondary winding;
wherein components of the primary circuit are located on the primary-circuit side of the PCB; and
components of the secondary circuit are located on the secondary-circuit side of the PCB.

7. The case of any one claims 1-6, wherein the first isolation barrier and the second isolation barrier are adjacent to each other such that any applicable creepage or clearance distance between the primary-circuit side and the secondary-circuit side is a distance between a top of a component on one of the primary-circuit side and the secondary-circuit side and a bottom of the PCB of the other of the secondary-circuit side and the primary-circuit side.

\* \* \* \* \*